United States Patent
Higuma et al.

(10) Patent No.: US 9,214,376 B2
(45) Date of Patent: Dec. 15, 2015

(54) SUBSTRATE MOUNTING STAGE AND SURFACE TREATMENT METHOD THEREFOR

(75) Inventors: Masakazu Higuma, Nirasaki (JP); Yasuharu Sasaki, Nirasaki (JP); Tadashi Aoto, Nirasaki (JP); Eiichiro Kikuchi, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 2173 days.

(21) Appl. No.: 12/028,904

(22) Filed: Feb. 11, 2008

(65) Prior Publication Data
US 2008/0217291 A1 Sep. 11, 2008

Related U.S. Application Data

(60) Provisional application No. 60/916,312, filed on May 7, 2007.

(30) Foreign Application Priority Data

Feb. 14, 2007 (JP) ................. 2007-033503

(51) Int. Cl.
| | |
|---|---|
| C23C 16/50 | (2006.01) |
| C23C 16/00 | (2006.01) |
| C23F 1/00 | (2006.01) |
| H01L 21/306 | (2006.01) |
| H01L 21/687 | (2006.01) |
| C23C 16/458 | (2006.01) |
| H01L 21/673 | (2006.01) |
| H01J 37/20 | (2006.01) |

(52) U.S. Cl.
CPC ...... *H01L 21/68757* (2013.01); *C23C 16/4581* (2013.01); *H01J 37/20* (2013.01); *H01L 21/67366* (2013.01); *H01L 21/6875* (2013.01)

(58) Field of Classification Search
USPC ......... 118/715, 728–732; 156/345.51–345.55
See application file for complete search history.

(56) References Cited

U.S. PATENT DOCUMENTS

| | | | |
|---|---|---|---|
| 5,530,616 A | 6/1996 | Kitabayashi et al. | |
| 5,810,933 A | 9/1998 | Mountsier et al. | |
| 6,063,203 A * | 5/2000 | Satoh ............................ | 118/728 |
| 6,267,076 B1 * | 7/2001 | Annapragada et al. ........ | 118/723 ME |
| 2001/0016273 A1 * | 8/2001 | Narasimhan et al. .......... | 428/698 |
| 2002/0058469 A1 * | 5/2002 | Pinheiro et al. ............... | 451/526 |
| 2003/0026917 A1 * | 2/2003 | Lin et al. ........................ | 427/453 |
| 2004/0168640 A1 * | 9/2004 | Muto et al. ..................... | 118/728 |
| 2007/0047170 A1 * | 3/2007 | Sun et al. ....................... | 361/234 |

FOREIGN PATENT DOCUMENTS

| | | |
|---|---|---|
| JP | 10-340896 | 12/1998 |
| JP | 2004-522281 | 7/2004 |
| JP | 2007-258240 | 10/2007 |
| KR | 0142055 | 7/1998 |
| KR | 1020060132466 A | 12/2006 |
| TW | 300312 | 2/1996 |
| TW | 411594 | 11/2000 |
| WO | WO 03/003404 A2 | 1/2003 |

* cited by examiner

*Primary Examiner* — Maureen Passey
*Assistant Examiner* — Tiffany Nuckols
(74) *Attorney, Agent, or Firm* — Oblon, McClelland, Maier & Neustadt, L.L.P.

(57) ABSTRACT

A substrate mounting stage that prevents poor attraction of substrates so as to improve the operating rate of a substrate processing apparatus. The substrate mounting stage is disposed in the substrate processing apparatus and has a substrate mounting surface on which a substrate is mounted. The arithmetic average roughness (Ra) of the substrate mounting surface is not less than a first predetermined value, and the initial wear height (Rpk) of the substrate mounting surface is not more than a second predetermined value.

16 Claims, 10 Drawing Sheets

COMPARATIVE EXAMPLE 1

COMPARATIVE EXAMPLE 2

COMPARATIVE EXAMPLE 4

EXAMPLE 1

EXAMPLE 2

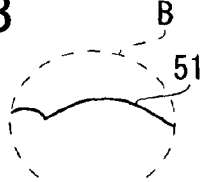
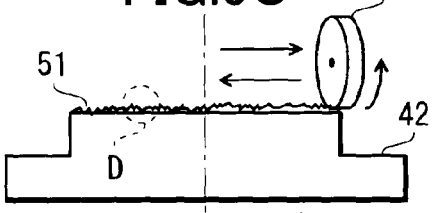
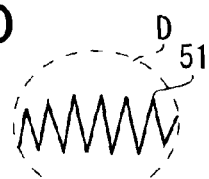
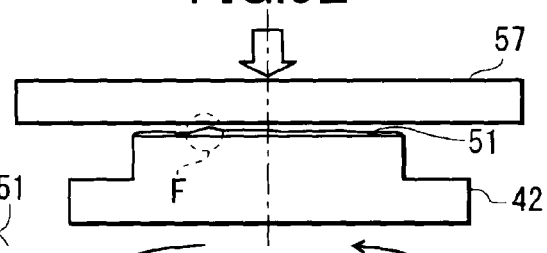
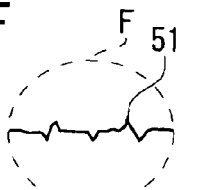
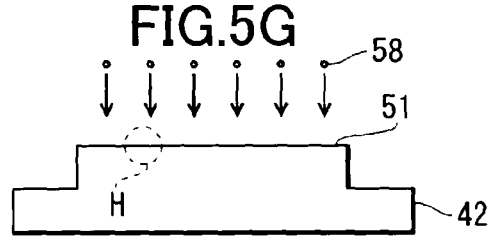
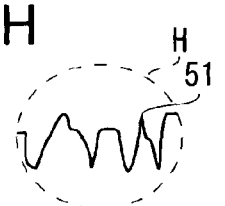
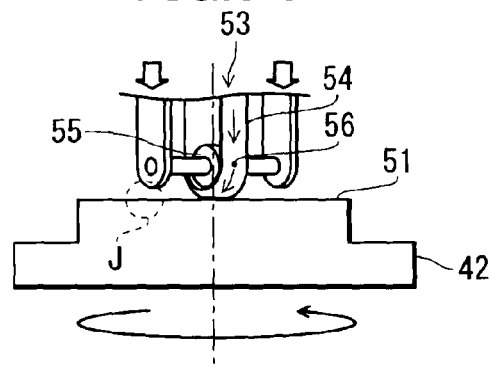
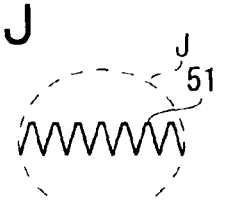

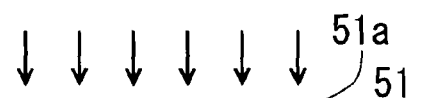
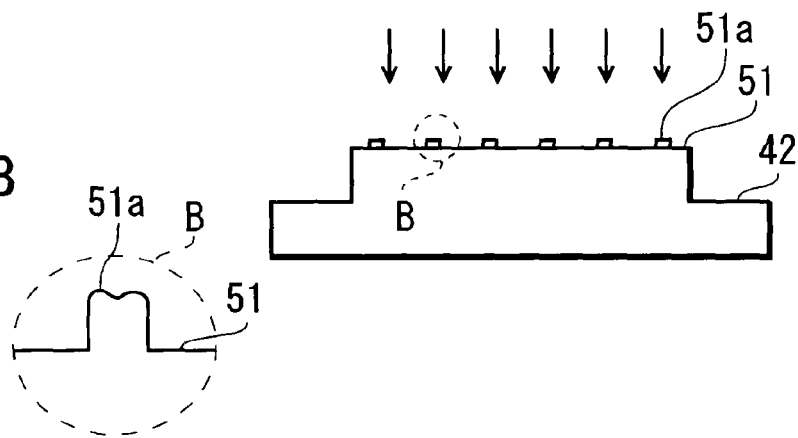
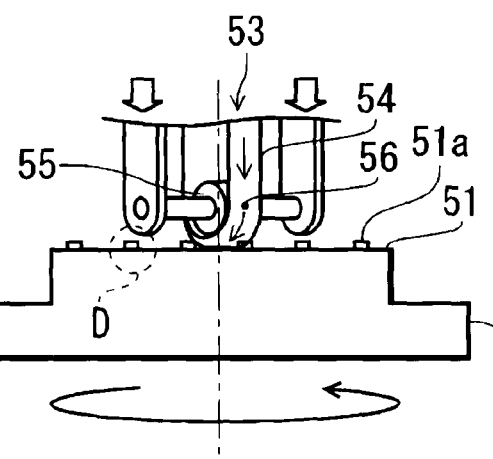
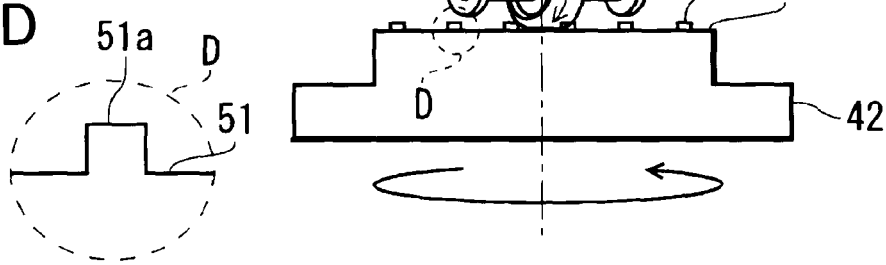

FIG.9A
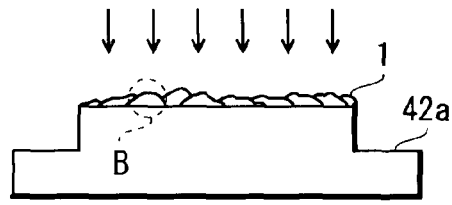
FIG.9B
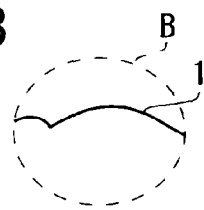
FIG.9C
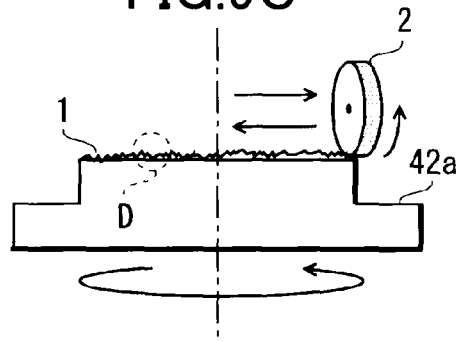
FIG.9D
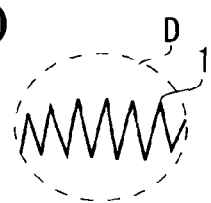
FIG.9E
FIG.9F
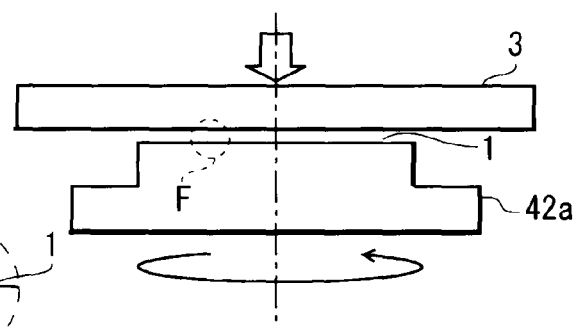
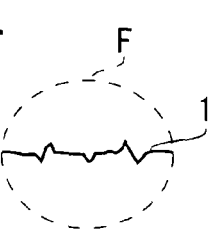
FIG.9G
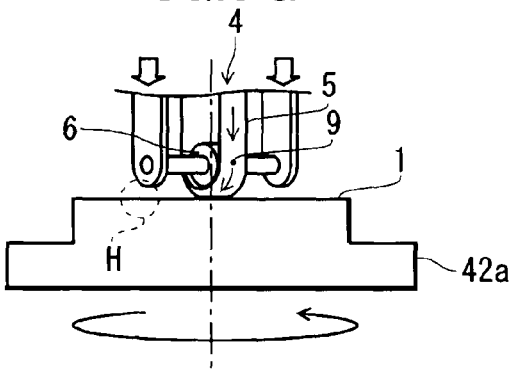
FIG.9H
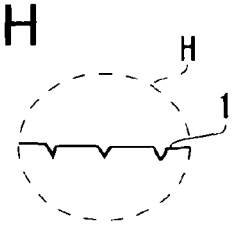

SUBSTRATE MOUNTING STAGE AND SURFACE TREATMENT METHOD THEREFOR

BACKGROUND OF THE INVENTION

1. Field of the Invention

The present invention relates to a substrate mounting stage and a surface treatment method therefor, and in particular to a substrate mounting stage whose surface has a thermally sprayed coating film formed thereon, and a surface treatment method therefor.

2. Description of the Related Art

Substrate processing apparatuses that carry out plasma processing such as etching processing on wafers as substrates have a housing chamber in which a wafer is housed, and a mounting stage that is disposed in the housing chamber and on which the wafer is mounted. In such substrate processing apparatuses, plasma is produced in the housing chamber, and the wafer is subjected to the etching processing by the plasma.

The mounting stage has in an upper portion thereof an electrostatic chuck comprised of an insulating member having an electrode plate therein, the wafer being mounted on the electrostatic chuck. While the wafer is being subjected to the etching processing, a DC voltage is applied to the electrode plate, the electrostatic chuck attracting the wafer thereto through a Coulomb force or a Johnsen-Rahbek force generated by the DC voltage.

Moreover, a coolant chamber is provided inside the mounting stage. A coolant, for example cooling water or a Galden (registered trademark) fluid at a predetermined temperature is supplied into the coolant chamber from a chiller unit. A processing temperature of the wafer attracted to and held on a surface of the electrostatic chuck is controlled through the temperature of the coolant.

Conventionally, first, a thermally sprayed coating film is formed on the surface of the electrostatic chuck by thermally spraying with a ceramic such as alumina. Next, a grindstone obtained by compacting together abrasive grains and making into a disk shape is brought into contact with the surface of the electrostatic chuck on which the thermally sprayed coating film has been formed. The grindstone is then rotated, and also moved parallel to the surface of the electrostatic chuck on which the thermally sprayed coating film has been formed. As a result, the surface of the electrostatic chuck is ground, i.e. processed.

However, an electrostatic chuck processed using the conventional method has a rough surface when viewed microscopically, and furthermore there are minute undulations on the surface of the electrostatic chuck. A wafer attracted to and held on the electrostatic chuck contacts the surface of the electrostatic chuck, and hence the temperature of the wafer depends on the contact area between the wafer and the surface of the electrostatic chuck. If the surface of the electrostatic chuck is rough, then there is a problem that the contact area between the wafer and the surface of the electrostatic chuck is small, and hence the thermal contact resistance of the contacting portion becomes high, and the efficiency of heat transfer from the electrostatic chuck to the wafer becomes poor.

To address the above described problem, the present inventors proposed an electrostatic chuck processing method in FIGS. 9A to 9H. In this processing method, first, a thermally sprayed coating film 1 is formed on a surface of an electrostatic chuck 42a by thermally spraying with a ceramic such as alumina (FIG. 9A), and a grindstone 2 obtained by compacting together abrasive grains and making into a disk shape is brought into contact with the surface of the electrostatic chuck 42a on which the thermally sprayed coating film 1 has been formed (FIG. 9B). The grindstone 2 is then rotated, and also moved parallel to the surface of the electrostatic chuck 42a on which the thermally sprayed coating film 1 has been formed. The electrostatic chuck 42a is also rotated about an axis of rotation shown by the alternate long and short dash line in FIG. 9C, and as a result, the surface of the electrostatic chuck 42a is ground rough (FIG. 9C). Next, a lapping plate 3 onto a surface of which is sprayed a slurry in which are mixed abrasive grains and a lubricant is brought into contact with the surface of the electrostatic chuck 42a that has been ground rough as shown in FIG. 9D. At this time, a load (shown by the white arrow in FIG. 9E) is applied to the lapping plate 3, and the electrostatic chuck 42a is rotated about an axis of rotation shown by the alternate long and short dash line in FIG. 9E, so that the surface of the electrostatic chuck 42a is ground flat (FIG. 9E). Then, by applying a load (shown by the white arrows in FIG. 9G) to a tape lapping apparatus 4 that has a tape 5 whose surface has abrasive grains 9 coated and fixed thereon and a roller 6 made of an elastic material, the tape 5 is brought into contact with the surface that has been ground flat (FIG. 9F). At this time, the tape 5 wound on the roller 6 is wound in and wound out by the tape lapping apparatus 4, the tape lapping apparatus 4 is moved parallel to the surface of the electrostatic chuck 42a, and the electrostatic chuck 42a is rotated about an axis of rotation shown by the alternate long and short dash line in FIG. 9G (FIG. 9G). As a result, the surface as shown in FIG. 9H can be obtained (see, for example, Japanese Laid-Open Patent Publication (Kokai) No. 2007-258240).

The electrostatic chuck 42a proposed by the present inventors can increase the contact area between a wafer W and the surface of the electrostatic chuck 42 when the wafer W is attracted to the surface of the electrostatic chuck 42a, and hence improve the efficiency of heat transfer between the wafer W and the surface of the electrostatic chuck 42a (FIG. 10A), but has a problem that when deposit or particles, for example CF type deposit D, arising as reaction product from plasma processing become attached to the surface of the electrostatic chuck 42a, the contact between the wafer W and the surface of the electrostatic chuck 42a is obstructed by the deposit D, and the wafer W cannot be attracted to the surface of the electrostatic chuck 42a (FIG. 10B).

If the contact between the wafer W and the surface of the electrostatic chuck 42a is obstructed by the deposit D, and the wafer W is caused to float above the surface of the electrostatic chuck 42a (FIG. 10B), helium gas as a heat transfer gas supplied into a gap between the wafer W and the surface of the electrostatic chuck 42a leaks from the gap. Upon detecting the leakage of the helium gas, the substrate processing apparatus recognizes poor attraction of the electrostatic chuck 42a and stops operating. To resume operation of the substrate processing apparatus, it is necessary to carry out maintenance such as cleaning the surface of the electrostatic chuck 42 and removing the deposit D, and hence there is a problem that the operating rate of the substrate processing apparatus is markedly decreased. This problem may arise not only in substrate processing apparatuses that subject oxidative objects to etching processing using CF type gas as a processing gas, but also in all the substrate processing apparatuses that use a processing gas from which a large amount of reaction product is produced, and all the substrate processing apparatuses that carry out processing in which a large number of particles and the like become attached to an electrostatic chuck.

SUMMARY OF THE INVENTION

The present invention provides a substrate mounting stage and a surface treatment method therefor that can prevent poor attraction of substrates so as to improve the operating rate of a substrate processing apparatus.

Accordingly, in a first aspect of the present invention, there is provided a substrate mounting stage that is disposed in a substrate processing apparatus that carries out processing on a substrate and has a substrate mounting surface on which the substrate is mounted, wherein an arithmetic average roughness (Ra) of the substrate mounting surface is not less than a first predetermined value, and an initial wear height (Rpk) of the substrate mounting surface is not more than a second predetermined value.

According to the first aspect of the present invention, the arithmetic average roughness (Ra) of the substrate mounting surface on which a substrate is mounted is not less than a first predetermined value, and the initial wear height (Rpk) of the substrate mounting surface is not more than a second predetermined value. Thus, the substrate mounting surface has an extreme surface layer thereof smoothed and has valley-shaped portions formed therein. Specifically, a plurality of mountain-shaped portions and a plurality of valley-shaped portions are formed in the extreme surface layer of the substrate mounting surface, and furthermore top portions of the respective mountain-shaped portions are ground away. Thus, mounting a substrate on the substrate mounting surface does not cause the shapes of the top portions of the mountain-shaped portions in the extreme surface layer of the substrate mounting surface to change with repetition of processing in the substrate processing apparatus, and the contact area between substrates, which are sequentially subjected to the processing, and the substrate mounting surface can be made uniform. Thus, the efficiency of heat transfer between the substrates and the substrate mounting surface can be made uniform, and hence the processing temperature of the substrates during the processing in the substrate processing apparatus can be made constantly uniform. Moreover, when deposit arising from the processing in the substrate processing apparatus becomes attached to the substrate mounting surface, the deposit is pressed into the valley-shaped portions when a substrate is mounted on the substrate mounting portion. Thus, the contact between the substrate mounting surface and the substrate is not obstructed, and hence even when deposit becomes attached to the substrate mounting surface, the substrate mounting stage can maintain a good substrate attracting force. There is thus no need to carry out maintenance such as cleaning the substrate mounting surface and removing deposit, and hence the operating rate of the substrate processing apparatus can be improved.

The first aspect of the present invention can provide a substrate mounting stage, wherein the first predetermined value is 0.45.

According to the first aspect of the present invention, because the arithmetic average roughens (Ra) of the substrate mounting surface is not less than 0.45, a plurality of valley-shaped portions can be reliably formed in the extreme surface layer of the substrate mounting surface. Thus, when deposit becomes attached to the substrate mounting surface, the deposit is reliably pressed into the valley-shaped portions when a substrate is mounted on the substrate mounting portion. For this reason, the contact between the substrate mounting surface and the substrate can be reliably prevented from being obstructed, and hence the substrate mounting stage can reliably maintain a good substrate attracting force.

The first aspect of the present invention can provide a substrate mounting stage, wherein the second predetermined value is 0.35.

According to the first aspect of the present invention, because the initial wear height (Rpk) of the substrate mounting surface is not more than 0.35, the extreme surface layer of the substrate mounting surface can be reliably smoothed. Thus, the shapes of the top portions of the mountain-shaped portions in the extreme surface layer of the substrate mounting surface can be reliably prevented from changing, and the contact area between substrates, which are sequentially subjected to the processing, and the substrate mounting surface can be reliably made uniform. As a result, the efficiency of heat transfer between the substrates and the substrate mounting surface can be reliably and constantly made uniform.

The first aspect of the present invention can provide a substrate mounting stage, wherein a roughness curve skewness (Rsk) of the substrate mounting surface is not more than −1.5.

According to the first aspect of the present invention, the roughness curve skewness (Rsk) of the substrate mounting surface is not more than −1.5. Thus, the contact area between the substrate and the substrate mounting surface can be increased, and hence the efficiency of heat transfer between the substrate and the substrate mounting surface can be increased, so that the processing temperature of the substrate can be controlled with good response.

The first aspect of the present invention can provide a substrate mounting stage, wherein a roughness curve relative load length rate (Rmr (−1.5 μm)) of the substrate mounting surface is not less than 50%.

According to the first aspect of the present invention, the roughness curve relative load length rate (Rmr (−1.5 μm)) of the substrate mounting surface is not less than 50%. Thus, the actual contact area between the substrate and the substrate mounting surface can be increased, and hence the efficiency of heat transfer between the substrate and the substrate mounting surface can be reliably improved, so that the processing temperature of the substrate can be reliably controlled with good response.

The first aspect of the present invention can provide a substrate mounting stage, wherein a roughness curve relative load length rate (Rmr (0.5 μm)) of the substrate mounting surface is not less than 5%.

According to the first aspect of the present invention, the roughness curve relative load length rate (Rmr (−0.5 μm)) is not less than 5%. Thus, the actual contact area between the substrate and the substrate mounting surface can be reliably increased.

The first aspect of the present invention can provide a substrate mounting stage, wherein a maximum height roughness (Rz) of the substrate mounting surface is not less than 3.

According to the first aspect of the present invention, because the maximum height roughness (Rz) of the substrate mounting surface is not less than 3, valley-shaped portions can be reliably formed in the substrate mounting surface. Thus, when deposit becomes attached to the substrate mounting surface, the deposit can be reliably pressed into the valley-shaped portions when the substrate is mounted on the substrate mounting surface.

The first aspect of the present invention can provide a substrate mounting stage, wherein a value obtained by adding together a core part level difference (Rk) and an oil reservoir depth (Rvk) of the substrate mounting surface is not less than 2.

According to the first aspect of the present invention, because a value obtained by adding together the core part level difference (Rk) and the oil reservoir depth (Rvk) of the substrate mounting surface is not less than 2, valley-shaped portions can be satisfactorily formed in the substrate mounting surface. Thus, when deposit becomes attached to the substrate mounting surface, the deposit can be reliably pressed into the valley-shaped portions when the substrate is mounted on the substrate mounting surface.

The first aspect of the present invention can provide a substrate mounting stage, wherein an arithmetic average wave (Wa) of the substrate mounting surface is not less than 0.07.

According to the first aspect of the present invention, because the arithmetic average wave (Wa) of the substrate mounting surface is not less than 0.07, mountain-shaped portions and valley-shaped portions can be reliably formed in the substrate mounting surface.

The first aspect of the present invention can provide a substrate mounting stage, wherein a maximum height wave (Wz) of the substrate mounting surface is not less than 0.4.

According to the first aspect of the present invention, because the maximum height wave (Wz) of the substrate mounting surface is not less than 0.4, mountain-shaped portions and valley-shaped portions can be satisfactorily formed in the substrate mounting surface.

Accordingly, in a second aspect of the present invention, there is provided a substrate mounting stage that is disposed in a substrate processing apparatus that carries out processing on a substrate and has a substrate mounting surface on which the substrate is mounted, wherein the substrate mounting surface has a plurality of projections that are brought into contact with the substrate, and an initial wear height (Rpk) of the substrate mounting surface is not more than a predetermined value.

According to the second aspect of the present invention, the initial wear height (Rpk) of the substrate mounting surface having the plurality of projections that are brought into contact with the substrate is not more than a predetermined value. The substrate mounting surface has in the extreme surface layer thereof the plurality of projections and a plurality of concave portions formed between the adjacent projections, and the top portions of the projections are smoothed. Thus, mounting a substrate on the substrate mounting surface does not cause the shapes of the top portions of the projections in the extreme surface layer of the substrate mounting surface to change with repetition of processing in the substrate processing apparatus, and the contact area between substrates, which are sequentially subjected to the processing, and the substrate mounting surface can be made constantly uniform. Thus, the efficiency of heat transfer between the substrates and the substrate mounting surface can be made constantly uniform, and hence the processing temperature of the substrates during the processing in the substrate processing apparatus can be made uniform. Moreover, when deposit arising from the processing in the substrate processing apparatus becomes attached to the substrate mounting surface, the deposit is pressed into the concave portions when the substrate is mounted on the substrate mounting surface. Thus, the contact between the substrate mounting surface and the substrate is not obstructed, and hence even when deposit becomes attached to the substrate mounting surface, the substrate mounting stage can maintain a good substrate attracting force. There is thus no need to carry out maintenance such as cleaning the substrate mounting surface and removing deposit, and hence the operating rate of the substrate processing apparatus can be improved.

Accordingly, in a third aspect of the present invention, there is provided a surface treatment method for a substrate mounting surface of a substrate mounting stage that is disposed in a substrate processing apparatus that carries out processing on a substrate and on which the substrate is mounted, comprising a processing step of processing the substrate mounting surface so that an arithmetic average roughness (Ra) of the substrate mounting surface is not less than a first predetermined value, and a smoothing step of processing the substrate mounting surface processed in the processing step so that an initial wear height (Rpk) of the substrate mounting surface is not more than a second predetermined value.

The third aspect of the present invention can provide a surface treatment method, wherein the first predetermined value is 0.45.

The third aspect of the present invention can provide a surface treatment method, wherein the second predetermined value is 0.35.

The third aspect of the present invention can provide a surface treatment method, wherein the processing step comprises a flattening step of flattening the substrate mounting surface, and a roughing step of roughing the substrate mounting surface flattened in the flattening step.

According to the third aspect of the present invention, because the substrate mounting surface is flattened, and the flattened substrate mounting surface is roughed, the extreme surface layer of the substrate mounting surface can be flattened, and valley-shaped portions can be formed in the extreme surface layer of the substrate mounting surface. Thus, the actual contact area between the substrate and the substrate mounting surface can be increased, and hence the efficiency of heat transfer between the substrate and the substrate mounting surface can be improved.

The third aspect of the present invention can provide a surface treatment method, wherein in the smoothing step, lapping processing is carried out using a selected one of a tape, a lapping plate, and a pad that are coated with fine abrasive grains having a grain diameter equal to or smaller than a grain diameter of a material of the substrate mounting surface.

According to the third aspect of the present invention, because the lapping processing is carried out using a selected one of a tape, a lapping plate, and a pad that are coated with fine abrasive grains having a grain diameter equal to or smaller than the grain diameter of the material of the substrate mounting surface, the extreme surface layer of the substrate mounting surface can be reliably smoothed using an inexpensive construction.

The third aspect of the present invention can provide a surface treatment method, wherein in the smoothing step, a member having a lower hardness than a hardness of a material of the substrate mounting surface is pressed against the substrate mounting surface, and the member is slid.

According to the third aspect of the present invention, because the member having a lower hardness than the hardness of the material of the substrate mounting surface is pressed against the substrate mounting surface, and the member is slid, the extreme surface layer of the substrate mounting surface can be finely smoothed using an inexpensive construction.

The third aspect of the present invention can provide a surface treatment method, wherein in the smoothing step, a member having a higher hardness than a hardness of a material of the substrate mounting surface is pressed against the substrate mounting surface, and the member is slid.

According to the third aspect of the present invention, because the member having a higher hardness than the hardness of the material of the substrate mounting surface is pressed against the substrate mounting surface, and the member is slid, the extreme surface layer of the substrate mounting surface can be quickly smoothed using an inexpensive construction.

The third aspect of the present invention can provide a surface treatment method, wherein in the smoothing step, compression processing in which an pressing member is pressed against the substrate mounting surface repeatedly or at a predetermined pressure is carried out.

According to the third aspect of the present invention, because the compression processing in which the pressing member is pressed against the substrate mounting surface repeatedly or at a predetermined load is carried out, the extreme surface layer of the substrate mounting surface can be reliably smoothed using an inexpensive construction.

The third aspect of the present invention can provide a surface treatment method, wherein the substrate mounting stage comprises an electrostatic chuck that attracts thereto the substrate or a member to be processed, and in the smoothing step, the substrate or the member to be processed is mounted on the substrate mounting surface, and the electrostatic chuck attracts thereto the substrate or the member to be processed.

According to the third aspect of the present invention, the substrate or the member to be processed is mounted on the substrate mounting surface of the substrate mounting stage which is an electrostatic chuck, and the electrostatic chuck attracts thereto the substrate or the member to be processed. At this time, the substrate mounting surface is pressed by the substrate or the member to be processed, and hence the extreme surface layer of the substrate mounting surface, which contacts the substrate or the member to be processed, can be smoothed.

The third aspect of the present invention can provide a surface treatment method, wherein the substrate mounting stage comprises an electrostatic chuck that attracts thereto the substrate or a member to be processed, and in the smoothing step, a heating step in which the substrate or the member to be processed is mounted on the substrate mounting surface, and the substrate or the member to be processed is heated so that the substrate or the member to be processed is thermally expanded, and a cooling step in which the substrate or the member to be processed is cooled so that the substrate or the member to be processed is contracted are repeatedly carried out.

According to the third aspect of the present invention, the substrate or the member to be processed is mounted on the substrate mounting surface of the substrate mounting stage which is an electrostatic chuck, which attracts thereto the substrate or the member to be processed, and heating of the substrate or the member to be processed and cooling of the substrate or the member to be processed are repeatedly carried out. At this time, the substrate mounting surface is ground through the thermal expansion and contraction of the substrate or the member to be processed, and hence the extreme surface layer of the substrate mounting surface, which contacts the substrate or the member to be processed, can be finely smoothed.

The third aspect of the present invention can provide a surface treatment method, wherein in the smoothing step, the electrostatic chuck further repeatedly attaches and detaches the substrate or the member to be processed.

According to the third aspect of the present invention, the electrostatic chuck further repeatedly attaches and detaches the substrate or the member to be processed to and from the substrate mounting surface. At this time, the substrate mounting surface is repeatedly pressed by the substrate or the member to be processed, and hence the extreme surface layer of the substrate mounting surface, which contacts the substrate or the member to be processed, can be reliably smoothed.

The third aspect of the present invention can provide a surface treatment method, wherein a hardness of the substrate or the member to be processed is higher than a hardness of a material of the substrate mounting surface.

According to the third aspect of the present invention, the hardness of the substrate or the member to be processed is higher than the hardness of the material of the substrate mounting surface. Thus, the top portions of the mountain-shaped portions in the extreme surface layer of the substrate mounting surface can be caused to cut into the substrate or the member to be processed and sheared, and hence the extreme surface layer of the substrate mounting surface, which contacts the substrate or the member to be processed, can be more finely smoothed.

The third aspect of the present invention can provide a surface treatment method, wherein a hardness of the substrate or the member to be processed is lower than a hardness of a material of the substrate mounting surface.

According to the third aspect of the present invention, the hardness of the substrate or the member to be processed is lower than the hardness of the material of the substrate mounting surface. Thus, the top portions of the mountain-shaped portions in the extreme surface layer of the substrate mounting surface can be rubbed by the substrate or the member to be processed, and hence the extreme surface layer of the substrate mounting surface, which contacts the substrate or the member to be processed, can be more quickly smoothed.

Accordingly, in a fourth aspect of the present invention, there is provided a surface treatment method for a substrate mounting surface of a substrate mounting stage that is disposed in a substrate processing apparatus that carries out processing on a substrate and on which the substrate is mounted, comprising a smoothing step of processing the substrate mounting surface so that an initial wear height (Rpk) of the substrate mounting surface is not more than predetermined value, wherein the substrate mounting surface has a plurality of projections that are brought into contact with the substrate.

The features and advantages of the invention will become more apparent from the following detailed description taken in conjunction with the accompanying drawings.

BRIEF DESCRIPTION OF THE DRAWINGS

FIGS. 2A and 2B are enlarged views of a portion A shown in FIG. 1, in which FIG. 2A shows a state before plasma processing is carried out in the substrate processing apparatus, and FIG. 2B is a state after plasma processing has been carried out to a certain extent in the substrate processing apparatus;

FIGS. 3A to 3E are graphs showing the results of measurements on shapes of an attracting surface of an electrostatic chuck, in which FIG. 3A shows an example in which the attracting surface of the electrostatic chuck is processed using a conventional method, FIG. 3B shows an example in which the electrostatic chuck is disposed inside a substrate processing apparatus, and plasma processing has been carried out for 3000 hours or more, FIG. 3C shows an example in which the attracting surface of the electrostatic chuck has been processed using a conventional method proposed by the present inventors, FIG. 3D shows an example in which the attracting surface of the electrostatic chuck has been processed using a surface treatment method according to a first embodiment of the present invention, and FIG. 3E shows an example in which the attracting surface of the electrostatic chuck has been processed using a surface treatment method according to a second embodiment of the present invention;

FIGS. 4A to 4F are process drawings useful in explaining the surface treatment method according to the first embodiment of the present invention, in which FIG. 4A shows a thermally spraying step, FIG. 4B is an enlarged view of a portion B in FIG. 4A, FIG. 4C shows a grinding step, FIG. 4D is an enlarged view of a portion D in FIG. 4C, FIG. 4E shows a smoothing step, and FIG. 4F is an enlarged view of a portion F in FIG. 4E;

FIGS. 5A to 5J are process drawings useful in explaining the surface treatment method according to the second embodiment of the present invention, in which FIG. 5A shows a thermally spraying step, FIG. 5B is an enlarged view of a portion B in FIG. 5A, FIG. 5C shows a grinding step, FIG. 5D is an enlarged view of a portion D in FIG. 5C, FIG. 5E shows a flattening step, FIG. 5F is an enlarged view of a portion F in FIG. 5E, FIG. 5G shows a surface roughing step, FIG. 5H is an enlarged view of a portion H in FIG. 5G, FIG. 5I shows a smoothing step, FIG. 5J is an enlarged view of a portion J in FIG. 5I;

FIGS. 6A to 6D are process drawings useful in explaining a surface treatment method according to a third embodiment of the present invention, in which FIG. 6A shows a thermally spraying step, FIG. 6B is an enlarged view of a portion B in FIG. 6A, FIG. 6C shows a smoothing step, and FIG. 6D is an enlarged view of a portion D in FIG. 6C;

FIGS. 7A to 7D are views useful in explaining variations of the smoothing step in the surface treatment methods according to the above-mentioned embodiments, in which FIG. 7A shows a first variation, FIG. 7B shows a second variation, FIG. 7C shows a third variation, and FIG. 7D shows a fourth variation;

FIGS. 8A and 8B are views useful in explaining variations of the smoothing step in the surface treatment methods according to the above-mentioned embodiments, in which FIG. 8A shows a fifth variation, and FIG. 8B shows a sixth variation;

FIGS. 9A to 9H are process drawings useful in explaining a conventional surface treatment method, in which FIG. 9A shows a thermally spraying step, FIG. 9B is an enlarged view of a portion B in FIG. 9A, FIG. 9C shows a grinding step, FIG. 9D is an enlarged view of a portion D in FIG. 9C, FIG. 9E shows a flattening step, FIG. 9F is an enlarged view of a portion F in FIG. 9E, FIG. 9G shows a smoothing step, FIG. 9H is an enlarged view of a portion H in FIG. 9G; and FIGS. 10A and 10B are enlarged views of a contact area between a conventional electrostatic chuck and a wafer, in which FIG. 10A shows a state before plasma processing is carried out in a substrate processing apparatus, and FIG. 10B is a state after plasma processing has been carried out to a certain extent in the substrate processing apparatus.

DETAILED DESCRIPTION OF THE PREFERRED EMBODIMENTS

The present invention will now be described in detail below with reference to the drawings showing preferred embodiments thereof.

First, a description will be given of a substrate processing apparatus having a substrate mounting stage according to an embodiment of the present invention will be described.

Figure 1:
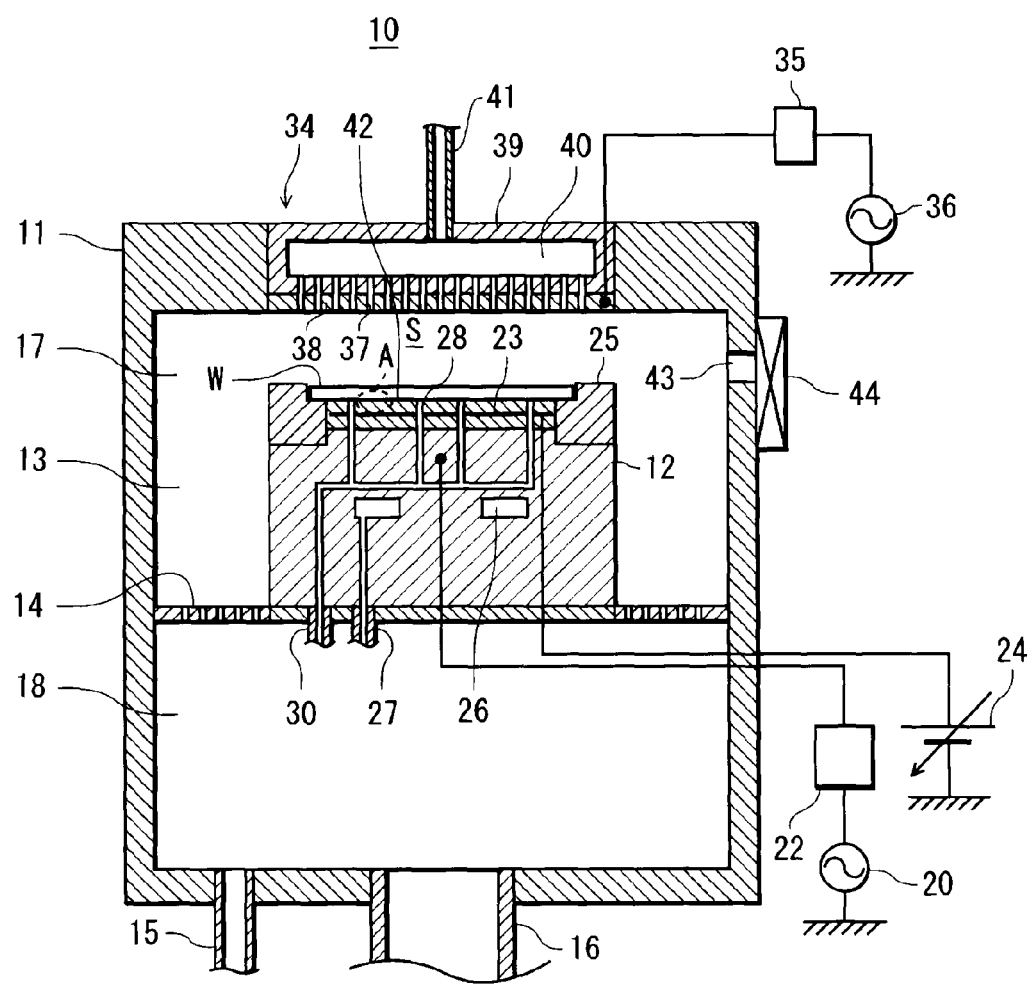
FIG. 1 is a sectional view schematically showing the construction of a substrate processing apparatus having a substrate mounting stage according to a first embodiment of the present invention.

FIG. 1 is a sectional view schematically showing the construction of the substrate processing apparatus having the substrate mounting stage according to the embodiment of the present invention. The substrate processing apparatus is constructed such as to carry out etching processing on a semiconductor wafer as a substrate.

As shown in FIG. 1, the substrate processing apparatus 10 has a chamber 11 in which is housed a semiconductor wafer (hereinafter referred to merely as a "wafer") W having a diameter of, for example, 300 mm. A cylindrical mounting stage 12 is disposed in the chamber 11 as a substrate mounting stage on which the wafer W is mounted. In the substrate processing apparatus 10, a side exhaust path 13 that acts as a flow path through which gas above the mounting stage 12 is exhausted out of the chamber 11 is formed between an inner wall surface of the chamber 11 and a peripheral surface of the mounting stage 12. An exhaust plate 14 is disposed part way along the side exhaust path 13. The inner wall surface of the chamber 11 is covered with quartz or yttria ($Y_2O_3$).

The exhaust plate 14 is a plate-shaped member having a large number of holes therein, and acts as a partitioning plate that partitions the chamber 11 into an upper portion and a lower portion. Plasma, described below, is produced in the upper portion (hereinafter referred to as the "reaction chamber") 17 of the chamber 11 partitioned by the exhaust plate 14. Moreover, a roughing exhaust pipe 15 and a main exhaust pipe 16 that exhaust gas out from the chamber 11 are provided in the lower portion (hereinafter referred to as the "manifold") 18 of the chamber 11. The roughing exhaust pipe 15 has a DP (dry pump) (not shown) connected thereto, and the main exhaust pipe 16 has a TMP (turbo-molecular pump) (not shown) connected thereto. Moreover, the exhaust plate 14 captures or reflects ions and radicals produced in a processing space S, described below, in the reaction chamber 17, thus preventing leakage of the ions and radicals into the manifold 18.

The roughing exhaust pipe 15, the main exhaust pipe 16, the DP, and the TMP together constitute an exhausting apparatus. The roughing exhaust pipe 15 and the main exhaust pipe 16 exhaust gas in the reaction chamber 17 out of the chamber 11 via the manifold 18. Specifically, the roughing exhaust pipe 15 reduces the pressure in the chamber 11 from atmospheric pressure down to a low vacuum state, and the main exhaust pipe 16 is operated in collaboration with the roughing exhaust pipe 15 to reduce the pressure in the chamber 11 from atmospheric pressure down to a high vacuum state (e.g. a pressure of not more than 133 Pa (1 torr)), which is at a lower pressure than the low vacuum state.

A lower radio frequency power source 20 is connected to the mounting stage 12 via a matcher 22. The lower radio frequency power source 20 applies predetermined radio frequency electrical power to the mounting stage 12. The mounting stage 12 thus acts as a lower electrode. The matcher 22 reduces reflection of the radio frequency electrical power from the mounting stage 12 so as to maximize the efficiency of the supply of the radio frequency electrical power into the mounting stage 12.

A disk-shaped electrostatic chuck 42 comprised of an insulating member having an electrode plate 23 therein is provided in an upper portion of the mounting stage 12, a surface of the electrostatic chuck 42 having been processed using a surface treatment method according to the present embodiment, described below. When a wafer W is mounted on the mounting stage 12, the wafer W is disposed on the electrostatic chuck 42. A DC power source 24 is electrically connected to the electrode plate 23. Upon a negative DC voltage being applied to the electrode plate 23, the wafer W is attracted to and held on an upper surface of the electrostatic chuck 42 through a Coulomb force or a Johnsen-Rahbek force.

Moreover, an annular focus ring 25 is provided on an upper portion of the mounting stage 12 so as to surround the wafer W attracted to and held on the upper surface of the electrostatic chuck 42. The focus ring 25 is exposed to a processing space S, and focuses plasma in the processing space S toward the front surface of the wafer W, thus improving the efficiency of the etching processing.

An annular coolant chamber 26 that extends, for example, in a circumferential direction of the susceptor 12 is provided inside the mounting stage 12. A coolant, for example cooling water or a Galden fluid, at a predetermined temperature is circulated through the coolant chamber 26 via coolant piping 27 from a chiller unit (not shown). A processing temperature of the wafer W attracted to and held on the upper surface of the electrostatic chuck 42 is controlled through the temperature of the coolant. It should be noted that a heater, a Peltier element (neither shown), or the like may be provided as a temperature control device inside the mounting stage 12.

A plurality of heat transfer gas supply holes 28 are provided in a portion of the upper surface of the electrostatic chuck 42 on which the wafer W is attracted and held (hereinafter referred to as the "attracting surface"). The heat transfer gas supply holes 28 are connected to a heat transfer gas supply unit (not shown) via a heat transfer gas supply line 30. The heat transfer gas supply unit supplies helium (He) gas as a heat transfer gas via the heat transfer gas supply holes 28 into a gap between the attracting surface of the mounting stage 12 and the rear surface of the wafer W. The helium gas supplied into the gap between the attracting surface of the mounting stage 12 and the rear surface of the wafer W transfers heat from the wafer W to the mounting stage 12.

A plurality of pusher pins (not shown) are provided in the attracting surface of the susceptor 12 as lifting pins that can be made to project out from the upper surface of the electrostatic chuck 42. The pusher pins are connected to a motor by a ball screw (neither shown), and can be made to project out from the attracting surface of the susceptor 12 through rotational motion of the motor, which is converted into linear motion by the ball screw. The pusher pins are housed inside the mounting stage 12 when a wafer W is being attracted to and held on the attracting surface of the mounting stage 12 so that the wafer W can be subjected to the etching processing, and are made to project out from the upper surface of the electrostatic chuck 42 so as to lift the wafer W up away from the mounting stage 12 when the wafer W is to be transferred out from the chamber 11 after having been subjected to the etching processing.

A gas introducing shower head 34 is disposed in a ceiling portion of the chamber 11 such as to face the mounting stage 12. An upper radio frequency power source 36 is connected to the gas introducing shower head 34 via a matcher 35. The upper radio frequency power source 36 applies predetermined radio frequency electrical power to the gas introducing shower head 34. The gas introducing shower head 34 thus acts as an upper electrode. The matcher 35 has a similar function to the matcher 22, described earlier.

The gas introducing shower head 34 has a ceiling electrode plate 38 having a large number of gas holes 37 therein, and an electrode support 39 on which the ceiling electrode plate 38 is detachably supported. A buffer chamber 40 is provided inside the electrode support 39. A processing gas introducing pipe 41 is connected to the buffer chamber 40. A processing gas, for example a mixed gas of a brominated gas or a chlorinated gas having $O_2$ gas and an inert gas such as He added thereto, supplied from the processing gas introducing pipe 41 into the buffer chamber 40 is supplied by the gas introducing shower head 34 into the reaction chamber 17 via the gas holes 37.

A transfer port 43 for the wafers W is provided in a side wall of the chamber 11 in a position at the height of a wafer W that has been lifted up from the mounting stage 12 by the pusher pins. A gate valve 44 for opening and closing the transfer port 43 is provided in the transfer port 43.

Radio frequency electrical power is applied to the mounting stage 12 and the gas introducing shower head 34 in the reaction chamber 17 of the substrate processing apparatus 10 as described above so as to apply radio frequency electrical power into the processing space S between the mounting stage 12 and the gas introducing shower head 34, whereupon the processing gas supplied into the processing space S from the gas introducing shower head 34 is turned into high-density plasma, whereby ions and radicals are produced; the wafer W is subjected to the etching processing by the ions and so on.

Operation of the component elements of the substrate processing apparatus 10 described above is controlled in accordance with a program for the etching processing by a CPU of a control unit (not shown) of the substrate processing apparatus 10.

Figure 2A:
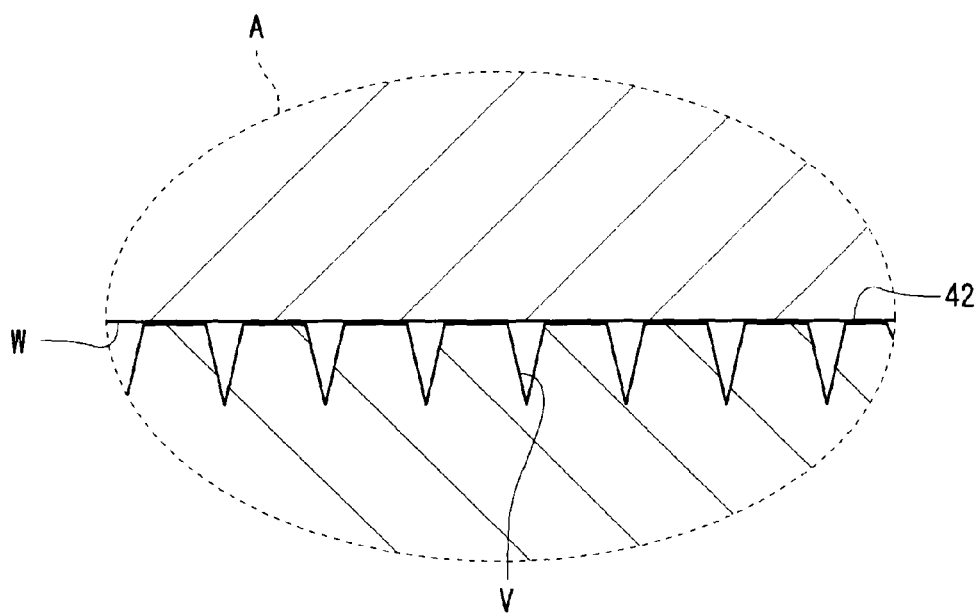
Figure 2B:
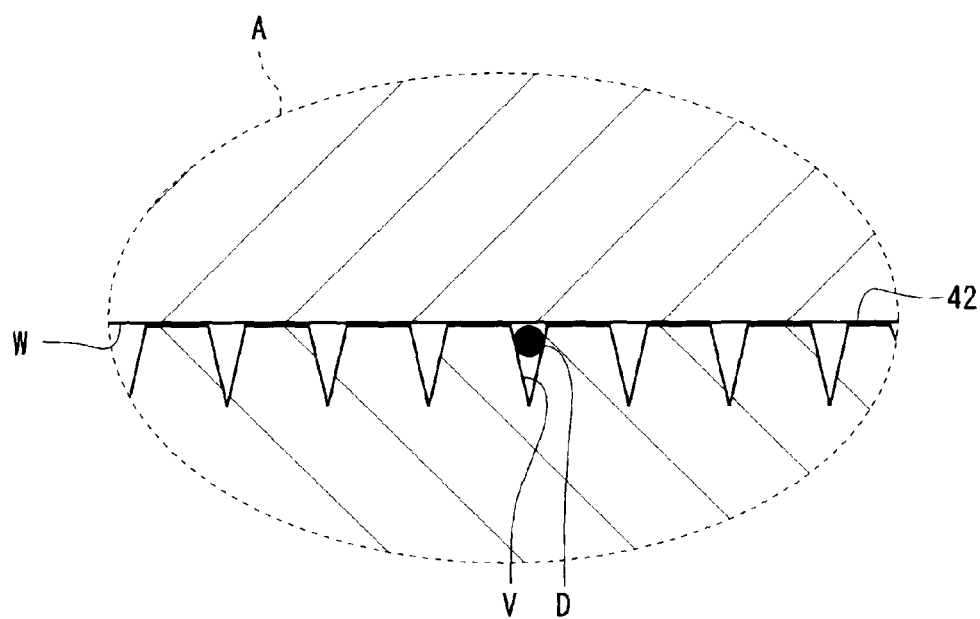

FIGS. 2A and 2B are enlarged views of a portion A shown in FIG. 1, in which FIG. 2A shows a state before the plasma processing is carried out in the substrate processing apparatus, and FIG. 2B shows a state after the plasma processing has been carried out to a certain extent in the substrate processing apparatus.

As shown in FIGS. 2A and 2B, in the present embodiment, the electrostatic chuck 42 has the attracting surface thereof made rough, but has an extreme surface layer of the attracting surface thereof smoothed. Specifically, a plurality of mountain-shaped portions and a plurality of valley-shaped portions V are formed in the extreme surface layer of the attracting surface, and furthermore top portions of the respective mountain-shaped portions are ground away. As a result, the actual contact area between the attracting surface of the electrostatic chuck 42 and the wafer W can be increased, and hence the efficiency of heat transfer between the wafer W and the attracting surface of the electrostatic chuck 42 can be improved. When controlling a processing temperature of the wafer W, there is thus no need to use a high-performance chiller unit, and hence power saving can be achieved for the chiller unit.

Moreover, even in the case that the etching processing carried out on the wafer W is divided into a plurality of steps, the efficiency of heat transfer between the wafer W and the attracting surface of the electrostatic chuck 42 is high, and hence the processing temperature of the wafer W when changing steps can be controlled with good response using a chiller unit, or a heater, a Peltier element, or the like provided inside the mounting stage 12. Therefore, the requirements of a variety of etching characteristics can be met.

Further, according to the present embodiment, because the plurality of mountain-shaped portions and the plurality of valleys V are formed in the extreme surface layer of the attracting surface, the valley-shaped portions V act as effective conduction paths for the heat transfer gas, and the temperature of the wafer W can be controlled more satisfactorily through the heat transfer gas. Specifically, the heat transfer gas that has been supplied from the heat transfer gas supply holes 28 and whose pressure has been controlled can be easily and instantaneously distributed over the entire attracting surface, and the processing temperature of the wafer W can thus be controlled with good response. It should be noted that in the case that the pressure of the heat transfer gas is controlled through two channels, e.g. a central portion of the attracting surface and a peripheral portion of the attracting surface, the in-plane distribution of the processing temperature of the wafer W may be arbitrarily controlled.

Moreover, because the electrostatic chuck 42 has the extreme surface layer of the attracting surface thereof smoothed, mounting the wafer W on the electrostatic chuck 42 does not cause the shapes of the top portions of the mountain-shaped portions in the extreme surface layer of the attracting surface to change with repetition of the plasma processing. Thus, the contact area between the wafers W, which are sequentially subjected to the plasma processing in the substrate processing apparatus 10, and the attracting surface of the electrostatic chuck 42 can be made uniform. As a result, the efficiency of heat transfer between the wafers W and the attracting surface of the electrostatic chuck 42 can be made uniform, and hence the processing temperature of the wafers W during the plasma processing can be made uniform.

Moreover, because the valley-shaped portions V are formed in the attracting surface of the electrostatic chuck 42, when CF type deposit D, for example, arising as reaction product from the plasma processing becomes attached to the attracting surface of the electrostatic chuck 42, the deposit D is pressed into the valley-shaped portions V as shown in FIG. 2B when the wafer W is mounted on the attracting surface. Thus, the contact between the attracting surface of the electrostatic chuck 42 and the wafer W is never obstructed, and hence even when the plasma processing has been carried out to a certain extent in the substrate processing apparatus 10, the electrostatic chuck 42 can maintain a good wafer attracting force. There is thus no need to carry out maintenance such as cleaning the attracting surface of the electrostatic chuck 42 and removing the deposit D, and hence the operating rate of the substrate processing apparatus can be improved.

It should be noted that the present embodiment is more effective in the case that the electrostatic chuck 42 is a Coulomb type electrostatic chuck using a Coulomb force. In general, because a JR type electrostatic chuck using a Johnsen-Rahbek force has a strong attracting force, embossing is carried out to form a plurality of projections on an attracting surface of the electrostatic chuck so as to weaken the attracting force. On this occasion, the contact area between the embossed attracting surface and a wafer W may be made very small, for example, not more than several %. On the other hand, because the Coulomb type electrostatic chuck has a weak attracting force, it is difficult to form macroscopic concave portions such as embossing over a wide range on an attracting surface of the Coulomb type electrostatic chuck so as to make the contact area between the attracting surface and a wafer W very small. However, with the electrostatic chuck 42 of the present embodiment, even if macroscopic concave portions are not provided on the attracting surface thereof, deposit is pressed into the microscopic valley-shaped portions formed in the extreme surface layer, and hence the contact between the attracting surface and the wafer W is not obstructed by the deposit. Moreover, the microscopic valley-shaped portions represented by surface property parameters of the extreme surface layer can be regarded as surfaces of contact with the wafer W from a Coulomb force perspective, and hence the entire attracting surface of the electrostatic chuck 42 can have a good attracting force, and as a result, a satisfactory attracting force can be achieved. It should be noted that the Coulomb type electrostatic chuck is characterized by the advantage of having a constant attracting force irrespective of film types of wafers to be mounted, and the advantage of easily carrying out an electricity removal process for removing a wafer W from the attracting surface after the wafer W has been subjected to processing.

Conventionally, among surface property parameters of an attracting surface of an electrostatic chuck, the arithmetic average roughness (Ra (JIS B0601)) and the maximum height roughness (Rz (JIS B0601)) have been drawing attention as parameters that affect the efficiency of heat transfer between the attracting surface and a wafer W. However, the present inventors estimated that the above parameters do not affect the efficiency of heat transfer between the attracting surface and a wafer W, but the initial wear height (Rpk (JIS B0671-2)), parameters based on load curves such as the roughness curve relative load length ratio (Rmr(c) (JIS B0601)), and parameters indicative of the shape of each mountain-shaped portion in an extreme surface layer such as the roughness curve skewness (Rsk (JIS B0601)) affect the efficiency of heat transfer between the attracting surface and a wafer W. Further, the present inventors estimated that regarding parameters indicative of the potential to absorb effects of foreign matter such as deposit D among surface property parameters of the attracting surface of the electrostatic chuck, the core part level difference (Rk (JIS B0671-2)), the oil reservoir depth (Rvk (JIS B0671-2)), the arithmetic average wave (Wa (JIS B0601)), the maximum height wave (Wz (JIS B0601)), and so on as well as the above described parameters Ra and Rz are parameters indicative of the potential to absorb the effects of foreign matter.

Figure 3A:
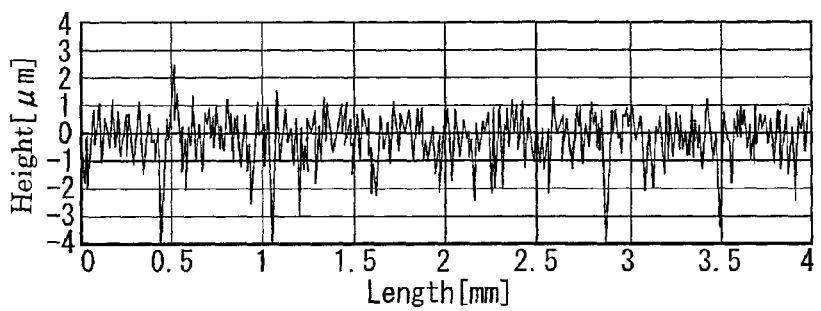
Figure 3B:
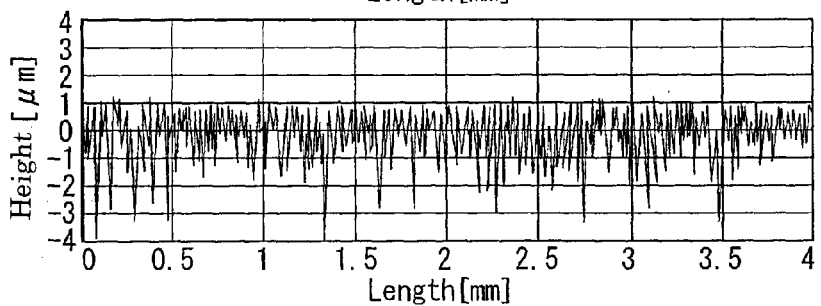
Figure 3C:
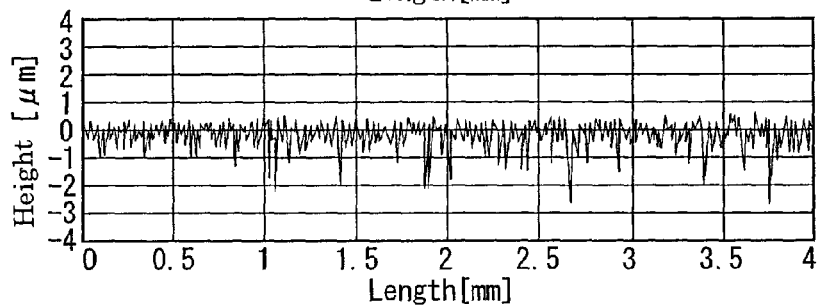

Then, the present inventors prepared an electrostatic chuck processed using a conventional method (comparative example 1), electrostatic chucks processed using a conventional method and disposed in a substrate processing apparatus, in which plasma processing was carried out for 3000 hours or more (comparative examples 2 and 3), and an electrostatic chuck processed using a conventional method proposed by the present inventors (comparative example 4), and measured the above described parameters (see Table 1). Further, the present inventors measured the shapes of attracting surfaces (see FIGS. 3A to 3C).

TABLE 1

| Parameters | Comparative example 1 | Comparative example 2 | Comparative example 3 | Comparative example 4 |
| --- | --- | --- | --- | --- |
| Rsk | −1.17 | −1.24 | −1.21 | −1.83 |
| Rpk | 0.36 | 0.34 | 0.28 | 0.12 |
| Rmr (−1.5 μm) | 45.8 | 49.5 | 51.3 | 96.0 |
| Rmr (−0.5 μm) | 3.1 | 4.7 | 5.1 | 39.2 |
| Ra | 0.64 | 0.68 | 0.67 | 0.27 |
| Rz | 5.13 | 5.29 | 5.29 | 2.63 |
| Rk + Rvk | 3.22 | 3.51 | 3.34 | 1.38 |
| Wa | 0.13 | 0.18 | 0.11 | 0.04 |
| Wz | 0.76 | 0.97 | 0.63 | 0.25 |

Then, the present inventors ascertained that the electrostatic chucks of the comparative examples 2 to 4 have a very high efficiency of heat transfer between the attracting surfaces thereof and wafers W and uniformly control the processing temperature of wafers W, which are sequentially subjected to plasma processing in the substrate processing apparatus, and the electrostatic chucks of the comparative examples 1 to 3 do not cause poor attraction of the wafers W even after plasma processing has been carried out to a certain extent in the substrate processing apparatus. Then, based on the measured parameters and the presence or absence of poor attraction, the present inventors estimated that if an attracting surface of an electrostatic chuck can be formed which satisfies the conditions that the initial wear height Rpk is about 0.35 (second predetermined value) and preferably not more than 0.35, the roughness curve skewness Rsk is about −1.5 and preferably not more than −1.5, the roughness curve relative load length rate Rmr (−1.5 μm) is about 50% and preferably not less than 50%, the arithmetic average roughness Ra is about 0.45 (first predetermined value) and preferably not less than 0.45, the maximum height roughness Rz is about 3 and preferably not less than 3, the core part level difference Rk+the oil reservoir depth Rvk is about 2 and preferably not less than 2, the arithmetic average wave Wa is about 0.07 and preferably not less than 0.07, and the maximum height wave Wz is about 0.4 and preferably not less than 0.4, then the efficiency of heat transfer between the attracting surface and wafers W can be high, the processing temperature of the wafers W can be uniformly controlled, and the attracting surface does not cause errors in attracting the wafers W.

Moreover, the present inventors measured the above parameters of the electrostatic chuck processed using the conventional method (comparative example 1) and the electrostatic chuck processed using the conventional method proposed by the present inventors (comparative example 4), and ascertained that it is difficult to manufacture an electrostatic chuck that satisfies all the above described conditions. Specifically, the present inventors ascertained that with the conventional method, that is, conventional grinding processing, the arithmetic average roughness Ra of the attracting surface can be easily made to be not less than 0.45, but it is difficult to satisfy the above described condition regarding the initial wear height Rpk while maintaining the arithmetic average roughness Ra at not less than 0.45. Moreover, the present inventors ascertained that with the conventional method proposed by the present inventors, that is, conventional plate lapping processing and tape lapping processing, because the initial wear height Rpk of the attracting surface of the electrostatic chuck can be easily made to be not more than 0.35, but it is difficult to satisfy the above described condition regarding the arithmetic average roughness Ra while maintaining the initial wear height Rpk at not more than 0.35.

Figure 3D:
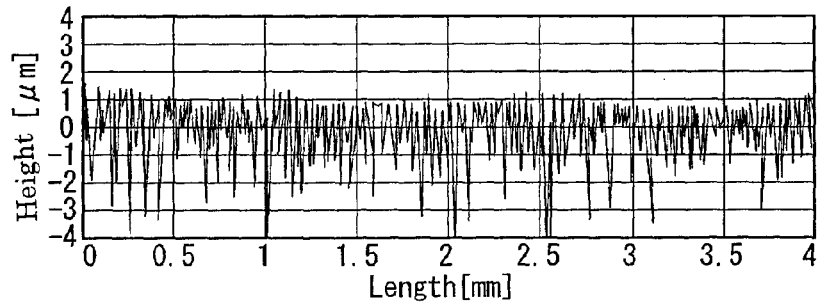
Figure 3E:
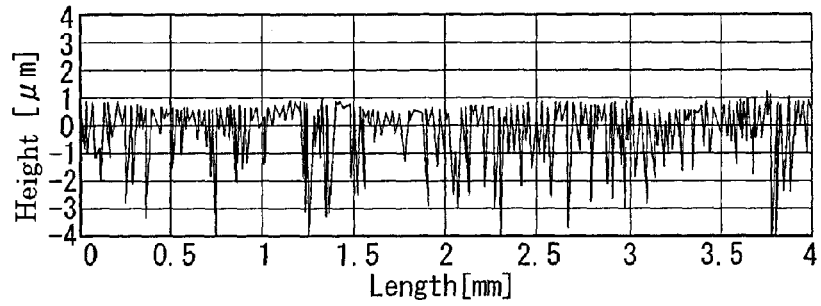

The present inventors thus came up with surface treatment methods according to embodiments of the present invention, described later, as methods of processing an attracting surface of an electrostatic chuck that satisfies all the above described parameter conditions. The attracting surface of the above described electrostatic chuck 42 shown in FIGS. 2A and 2B is processed using the surface treatment methods. Regarding the electrostatic chuck 42 as well, the present inventors measured the parameters as examples as in the case of the above described comparative examples, and ascertained that all the parameters satisfied the above described conditions. Further, the present inventors measured the shapes of attracting surfaces and obtained results shown in FIGS. 3D and 3E. It should be noted that in Table 2 and FIG. 3, the example 1 corresponds to an attracting surface processed using a surface treatment method according to a first embodiment of the present invention, and the example 2 corresponds to an attracting surface processed using a surface treatment method according to a second embodiment of the present invention, described later.

TABLE 2

| Parameters | Example 1 | Example 2 |
|---|---|---|
| Rsk | −2.64 | −1.77 |
| Rpk | 0.28 | 0.28 |
| Rmr (−1.5 μm) | 81.18 | 66.77 |
| Rmr (−0.5 μm) | 21.34 | 12.91 |
| Ra | 0.55 | 0.78 |
| Rz | 5.44 | 6.1 |
| Rk + Rvk | 2.79 | 3.41 |
| Wa | 0.12 | 0.17 |
| Wz | 0.81 | 0.95 |

The surface property parameters were measured using a stylus roughness measuring machine using a Gaussian filter whose cutoff value kc as a reference length is 0.8 mm based on JIS B0601, JIS B0633, and JIS B0655. With the evaluation length set to 4 mm, and the radius of the tip of a stylus set to 2 μm, the average value of measured values at 25 points within the attracting surface was calculated. It should be noted that wave parameters such as Wa and Wz were measured with the cutoff value λc set to 0.8 mm, the cutoff value λf set to 8 mm, and the evaluation length set to 24 mm.

Next, surface treatment methods according to embodiments of the present invention will be described.

First, a description will be given of a surface treatment method according to a first embodiment of the present invention.

FIGS. 4A to 4F are process drawings useful in explaining the surface treatment method according to the present embodiment.

Figure 4A:
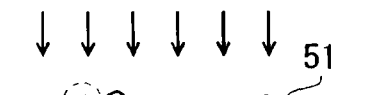
Figure 4B:
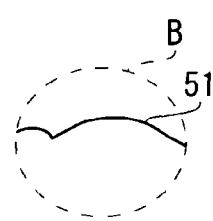
Figure 4C:
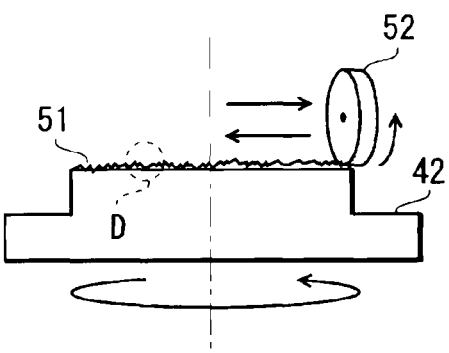
Figure 4D:
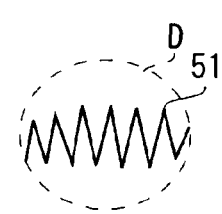
Figure 4E:
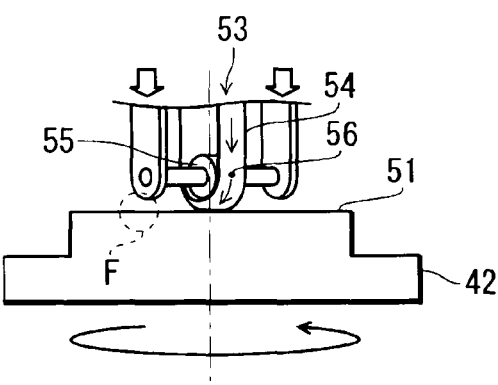
Figure 4F:
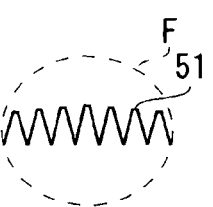

It should be noted that FIGS. 4B, 4D, and 4F are enlarged views of a portion B shown in FIG. 4A, a portion D shown in FIG. 4C, and a portion F shown in FIG. 4E, respectively.

First, a thermally sprayed coating film 51 is formed onto a surface of the electrostatic chuck 42 (FIG. 4B) by thermally spraying a ceramic such as alumina (FIG. 4A) (hereinafter referred to as the "thermal spraying step").

Next, a grindstone 52 obtained by compacting together abrasive grains and making into a disk shape is brought into contact with the surface of the electrostatic chuck 42 on which the thermally sprayed coating film 51 has been formed (FIG. 4B). The grindstone 52 is then rotated, and also moved parallel to the surface of the electrostatic chuck 42 on which the thermally sprayed coating film 51 has been formed. At this time, the electrostatic chuck 42 is also rotated about an axis of rotation shown by the alternate long and short dash line in FIG. 4C. As a result, the surface of the electrostatic chuck is ground rough (FIG. 4C) (hereinafter referred to as the "grinding step"). After the grinding step, as shown in FIG. 4D, the surface of the electrostatic chuck 42 is still rough, and furthermore the extreme surface layer of the surface of the electrostatic chuck 42 is also rough; there are a plurality of mountain-shaped portions and a plurality of valley-shaped portions in the extreme surface layer. In the grinding step, the surface of the electrostatic chuck 42 is ground rough so that the arithmetic average roughness (Ra) of the surface can be not less than 0.5.

Then, by applying a load (shown by the white arrows in FIG. 4E) to a tape lapping apparatus 53 having a tape 54 whose surface has abrasive grains 56 coated and fixed thereon and a roller 55 made of an elastic material, the tape 54 is made to contact the roughly ground surface of the electrostatic chuck 42 shown in FIG. 4D. The tape 54 wound on the roller 55 is wound in and wound out by the tape lapping apparatus 53. Also, the tape lapping apparatus 53 is moved parallel to the surface of the electrostatic chuck 42, and the electrostatic chuck 42 is rotated about the alternate long and short dash line in FIG. 4E (FIG. 4E) (hereinafter referred to as the "smoothing step"). In the smoothing step, top portions of the respective mountain-shaped portions in the extreme surface layer are ground away so that the initial wear height (Rpk) of the surface of the electrostatic chuck 42 is made to be not more than 0.4. As a result, the surface having the extreme surface layer thereof smoothed can be obtained as shown in FIG. 4F. The surface shown in FIG. 4F has the same form as the attracting surface of the electrostatic chuck 42 shown in FIGS. 2A and 2B.

Moreover, in the smoothing step, because the tape 54 is pressed against the surface of the electrostatic chuck 42 by the roller 55 made of an elastic material, the pressure of the tape 54 can be controlled through the elastic force of the roller 55, and hence the extreme surface layer of the surface of the electrostatic chuck 42 can be finely smoothed.

According to the surface treatment method of the present embodiment, a plurality of valley-shaped portions and a plurality of mountain-shaped portions having top portions thereof ground away can be formed in the extreme surface layer of the surface of the electrostatic chuck 42.

Next, a surface treatment method according to a second embodiment of the present invention will be described.

FIGS. 5A to 5J are process drawings of the surface treatment method according to the present embodiment.

It should be noted that FIGS. 5B, 5D, 5F, 5H, and 5J are enlarged views of a portion B shown in FIG. 5A, a portion D shown in FIG. 5C, a portion F shown in FIG. 5E, a portion H shown in FIG. 5G, and a portion J shown in FIG. 5I, respectively.

The present embodiment is basically the same as the first embodiment described above in terms of construction and operation. Features of the construction and operation that are the same as in the first embodiment will thus not be described, only features that are different from those of the first embodiment being described below.

First, after the thermal spraying step shown in FIG. 5A and the grinding step shown in FIG. 5C, a lapping plate 57 onto a surface of which is sprayed a slurry in which are mixed abrasive grains and a lubricant is brought into contact with the surface that has been ground rough (FIG. 5D). At this time, upon a load (indicated by the white arrow in FIG. 5E) being applied to the lapping plate 57, the electrostatic chuck 42 is also rotated about an axis of rotation shown by the alternate long and short dash line in FIG. 5E. As a result, the surface of the electrostatic chuck 42 is ground flat (FIG. 5E) (hereinafter referred to as the "flattening step").

Then, micro-blast processing in which abrasive grains 58 are made to collide with the surface that has been ground flat (FIG. 5F) at a predetermined jetting pressure is carried out. At this time, the surface of the electrostatic chuck 42 is ground rough through the collision of the abrasive grains 58, and a plurality of mountain-shaped portions and a plurality of valley-shaped portions are formed in the extreme surface layer (FIG. 5G) (hereinafter referred to as the "surface roughing step"). In the surface roughing step, the surface of the electrostatic chuck 42 is ground rough so that the arithmetic average roughness of the surface can be not less than 0.5.

Then, the smoothing step shown in FIG. 5I is carried out on the surface that has been ground rough (FIG. 5H). As a result, top portions of the respective mountain-shaped portions in the extreme surface layer are ground away, so that the surface having the extreme surface layer thereof smoothed as shown in FIG. 5J is obtained. The surface shown in FIG. 5J has the same form as the attracting surface of the electrostatic chuck 42 shown in FIGS. 2A and 2B.

According to the surface treatment method of the present embodiment, a plurality of valley-shaped portions and a plurality of mountain-shaped portions with top portions thereof ground away can be formed in the extreme surface layer of the surface of the electrostatic chuck 42.

Moreover, according to the surface treatment method of the present embodiment, because the electrostatic chuck 42 is subjected to the flattening step, then to the surface roughing step, and then to the smoothing step, the flatness of the entire attracting surface can be made very high, and the uniformity of the surface roughness of the entire attracting surface can be made very high. As a result, the efficiency of heat transfer between the entire attracting surface and a wafer W can be made uniform, and hence the in-plane processing temperature distribution of the wafer W can be made more uniform.

It should be noted that in the surface roughing step of the present embodiment, not only the above described micro-blast processing but also other processing may be carried out insofar as the surface can be roughed. For example, sputtering processing in which ions are made to collide with the surface or etching processing using chemical reaction may be carried out.

Next, a surface treatment method according to a third embodiment of the present invention will be described.

FIGS. 6A to 6D are process drawings of the surface treatment method according to the present embodiment.

It should be noted that FIGS. 6B and 6D are enlarged views of a portion B shown in FIG. 6A, and a portion D shown in FIG. 6C, respectively.

The present embodiment is basically the same as the above described embodiments in terms of construction and operation. Features of the construction and operation that are the same as in the above described embodiments will thus not be described, only features that are different from those of the first embodiment being described below.

First, a thermally sprayed coating film 51 that is made of a ceramic such as alumina and has a plurality of projections 51a thereon is formed on the surface of the electrostatic chuck 42 (FIG. 6A) (embossing processing). The top of each projection 51a (embossing) thus formed is not flat but uneven (FIG. 6B).

Then, the surface on which the projections 51a have been formed (FIG. 6B) is subjected to the smoothing step shown in FIG. 6C. As a result, a top portion of each projection 51a are ground, and an extreme surface layer of a surface of each projection 51a as shown in FIG. 6D is smoothed. The surface shown in FIG. 6D has the plurality of projections 51a each having the top portion thereof smoothed, and a plurality of concave portions formed between the adjacent projections 51a.

According to the surface treatment method of the present embodiment, a plurality of projections 51a each having the top thereof smoothed, and a plurality of concave portions between the adjacent projections 51a can be formed in the extreme surface layer of the attracting surface of the electrostatic chuck 42. In the electrostatic chuck 42, the actual contact area between a wafer W and the attracting surface (i.e. flat surfaces at the top of the projections 51a) of the electrostatic chuck 42 can be increased, and furthermore CF type deposit D can be pressed into the concave portions. It should be noted that the present embodiment is effective in the case that the electrostatic chuck 42 is a JR type electrostatic chuck, or a Coulomb type electrostatic chuck comprised of an insulating member made of a high dielectric constant material, and is particularly effective in the case that the electrostatic chuck 42 is an electrostatic chuck in which the contact area between projections and a wafer W is very small, for example, not more than several %.

Next, variations of the smoothing step in the surface treatment methods according to the above described embodiments will be described.

Figure 7A:
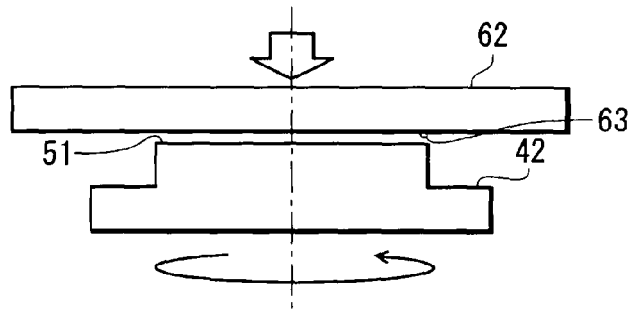

FIG. 7A is a view useful in explaining a first variation of the smoothing step in the surface treatment methods according to the above described embodiments.

As shown in FIG. 7A, a lapping plate 62 onto a surface of which is sprayed a slurry 63 in which abrasive grains having a grain diameter substantially equal to or smaller than the grain diameter of the material of a thermally-sprayed coating film 51 such as alumina are mixed with a lubricant is brought into contact with the surface of the electrostatic chuck 42. At this time, a load (indicated by the white arrow in FIG. 7A) is applied to the lapping plate 62, and the electrostatic chuck 42 is also rotated about an axis of rotation shown by the alternate long and short dash line in FIG. 7A. As a result, the thermally sprayed coating film 51 on the surface of the electrostatic chuck 42 is ground, and the extreme surface layer of the surface of the electrostatic chuck 42 is smoothed. Specifically, the top portions of the mountain-shaped portions in the extreme surface layer are removed.

The present variation can be implemented using the same lapping plate or a lapping plate of the same type as the lapping plate used in the surface treatment method according to the second embodiment of the present invention. In this case, in the smoothing step, fine abrasive grains smaller than abrasive grains used in the flattening step are used, and processing is carried out with a weaker grounding force, i.e. at a lower load and for a shorter grounding time than in the flattening step.

Moreover, the present variation is more effective if used in the smoothing step in the surface treatment method according to the second embodiment of the present invention. In the surface treatment method according to the second embodiment of the present invention, the entire attracting surface is processed such as to have a very high flatness in the flattening step before the surface roughing step, and hence even if a lapping plate is used in the smoothing step as in the present variation, the lapping plate can be made to uniformly contact the entire attracting surface processed through the surface roughing step. As a result, the entire attracting surface can be processed such as to have a uniform surface roughness.

According to the present variation, the lapping plate 62 onto the surface of which is sprayed the slurry 63 containing fine abrasive grains is brought into contact with the surface of the electrostatic chuck 42 so that the extreme surface layer of the surface of the electrostatic chuck 42 is smoothed. Thus, the extreme surface layer of the surface of the electrostatic chuck 42 can be reliably smoothed using an inexpensive construction.

Moreover, in the prevent variation, if fine abrasive grains having a higher hardness than the hardness of the material of the thermally sprayed coating film 51 are used, the thermally sprayed coating film 51 formed on the surface of the electrostatic chuck 42 can be easily ground, and hence the extreme surface layer of the surface of the electrostatic chuck 42 can be quickly smoothed. On the other hand, if fine abrasive grains having a lower hardness than the hardness of the material of the thermally sprayed coating film 51 are used, a fractured layer in an extreme surface layer of the thermally sprayed coating film 51 formed on the surface of the electrostatic chuck 42, which is detached or deformed through contact, can be selectively removed, and hence only the extreme surface layer of the surface of the electrostatic chuck 42 can be reliably smoothed.

Figure 7B:
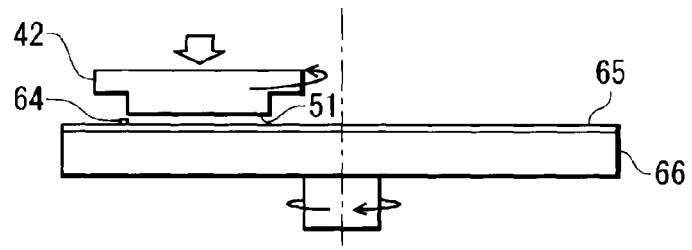

FIG. 7B is a view useful in explaining a second variation of the smoothing step in the surface treatment methods according to the above described embodiments.

As shown in FIG. 7B, the surface of the electrostatic chuck 42 is brought into contact with an upper surface of a rotary stage 66 on which is provided a pad 65 made of foamed polyurethane. At this time, the rotary stage 66 is rotated about an axis of rotation shown by the alternate long and short dash line in FIG. 7B, and a load (indicated by the white arrow in FIG. 7B) is applied to the electrostatic chuck 42. Then, the electrostatic chuck 42 is slid so that the thermally sprayed coating film 51 on the surface of the electrostatic chuck 42 is ground, and the extreme surface layer of the surface of the electrostatic chuck 42 is smoothed. Specifically, the top portions of the mountain-shaped portions in the extreme surface layer are removed. It should be noted that a slurry 64 in which abrasive grains having a grain diameter substantially equal to or smaller than the grain diameter of the material of the thermally-sprayed coating film 51 such as alumina are mixed with a lubricant is sprayed onto an upper surface of the pad 65.

According to the present variation, the surface of the electrostatic chuck 42 is brought into contact with the pad 65 onto which is sprayed the slurry 64 containing fine abrasive grains so that the extreme surface layer of the surface of the electrostatic chuck 42 is smoothed. Thus, the extreme surface layer of the surface of the electrostatic chuck 42 can be finely smoothed.

Moreover, according to the present variation, if fine abrasive grains having a higher or lower hardness than the hardness of the material of the thermally sprayed coating film 51 are used, the same effects as those in the above described first variation can be obtained.

Figure 7C:
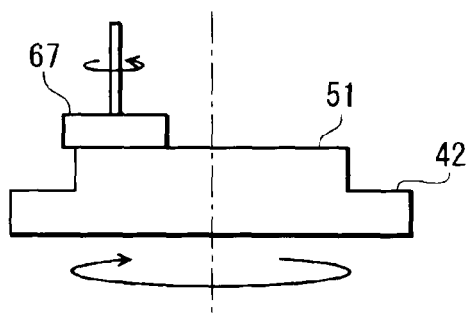

FIG. 7C is a view useful in explaining a third variation of the smoothing step in the surface treatment methods according to the above described embodiments.

As shown in FIG. 7C, a member 67 having a lower hardness than the hardness of the material of the thermally sprayed coating film 51 such as alumina is pressed against the surface of the electrostatic chuck 42. At this time, the member 67 is slid, and the electrostatic chuck 42 is also rotated about an axis of rotation shown by the alternate long and short dash line in FIG. 7C, so that the thermally sprayed coating film 51 on the surface of the electrostatic chuck 42 is ground, and the extreme surface layer of the surface of the electrostatic chuck 42 is smoothed. Specifically, the top portions of the mountain-shaped portions in the extreme surface layer cut into the member 67, and the top portions that have cut into the extreme surface layer are sheared through rotational force of the member 67. As a result, the top portions of the mountain-shaped portions are removed. It should be noted that examples of the member 67 having a lower hardness than the hardness of alumina include a member made of silicon.

According to the present variation, the member 67 having a low hardness is pressed against the surface of the electrostatic chuck 42 and then slid so that the extreme surface layer of the surface of the electrostatic chuck 42 is smoothed. Thus, the extreme surface layer of the surface of the electrostatic chuck 42 can be finely smoothed using an inexpensive construction.

Figure 7D:
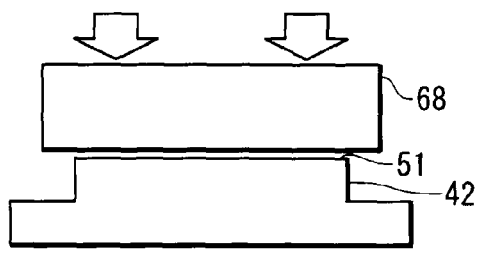

FIG. 7D is a view useful in explaining a fourth variation of the smoothing step in the surface treatment methods according to the above described embodiments.

As shown in FIG. 7D, a member 68 is brought into contact with the surface of the electrostatic chuck 42. At this time, upon a high load (indicated by the white arrows in FIG. 7D) being applied to the member 68, the thermally sprayed coating film 51 on the surface of the electrostatic chuck 42 is pressed, and the extreme surface layer of the surface of the electrostatic chuck 42 is smoothed. Specifically, the top portions of the mountain-shaped portions in the extreme surface layer are crushed by the member 68. As a result, the top portions of the mountain-shaped portions are smoothed.

According to the present variation, the member 68 is brought into contact with the surface of the electrostatic chuck 42, and a high load is applied to the member 68 so that the extreme surface layer of the surface of the electrostatic chuck 42 is smoothed. Thus, the extreme surface layer of the surface of the electrostatic chuck 42 can be reliably smoothed using an inexpensive construction. It should be noted that in the present variation, the load applied to the member 68 is such that it does not break the electrostatic chuck 42.

Figure 8A:
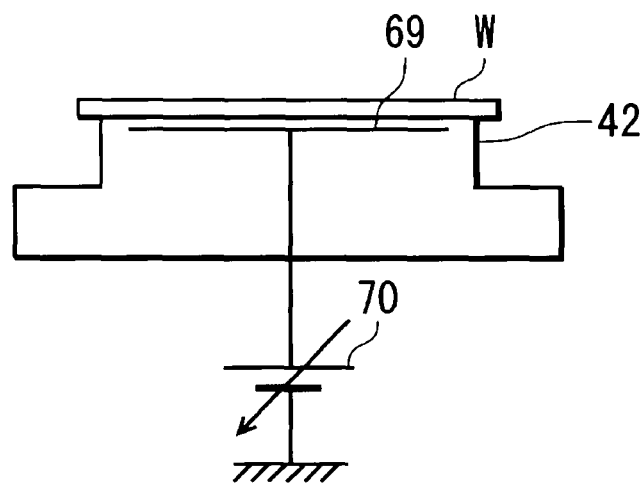

FIG. 8A is a view useful in explaining a fifth variation of the smoothing step in the surface treatment methods according to the above described embodiments.

As shown in FIG. 8A, a wafer W is mounted on the surface of the electrostatic chuck 42. Then, an attracting step in which a negative DC voltage is applied from a DC power source 70 to an electrode plate 69 inside the electrostatic chuck 42 so that the wafer W is attracted to the surface of the electrostatic chuck 42, and a detaching step in which the application of the negative DC voltage from the DC power source 70 to the electrode plate 69 is stopped so that the wafer W is detached from the surface of the electrostatic chuck 42 are repeatedly carried out. At this time, the thermally sprayed coating film 51 on the surface of the electrostatic chuck 42 is pressed by the wafer W, and the extreme surface layer of the surface of the electrostatic chuck 42 is smoothed. Specifically, the top portions of the mountain-shaped portions in the extreme surface layer are crushed by the wafer W, or rubbed by the wafer W to wear out. As a result, the top portions of the mountain-shaped portions are smoothed.

According to the present variation, the wafer W is mounted on the surface of the electrostatic chuck 42, and the wafer W is repeatedly attached to and detached from the surface of the electrostatic chuck 42 so that the extreme surface layer of the surface of the electrostatic chuck 42 is smoothed. Thus, the extreme surface layer of the surface of the electrostatic chuck 42, which contacts the wafer W, can be reliably smoothed.

Although in the present variation, the wafer W mounted on the surface of the electrostatic chuck 42 is made of silicon (Si), silicon carbide (SiC), or the like, but it is preferred that the wafer W is a member having a high hardness. Moreover, the member mounted on the surface of the electrostatic chuck 42 is not limited to being the wafer W, but rather may be any member (member to be processed) that can be electrostatically attracted to and detached from the surface of the electrostatic chuck 42.

Figure 8B:
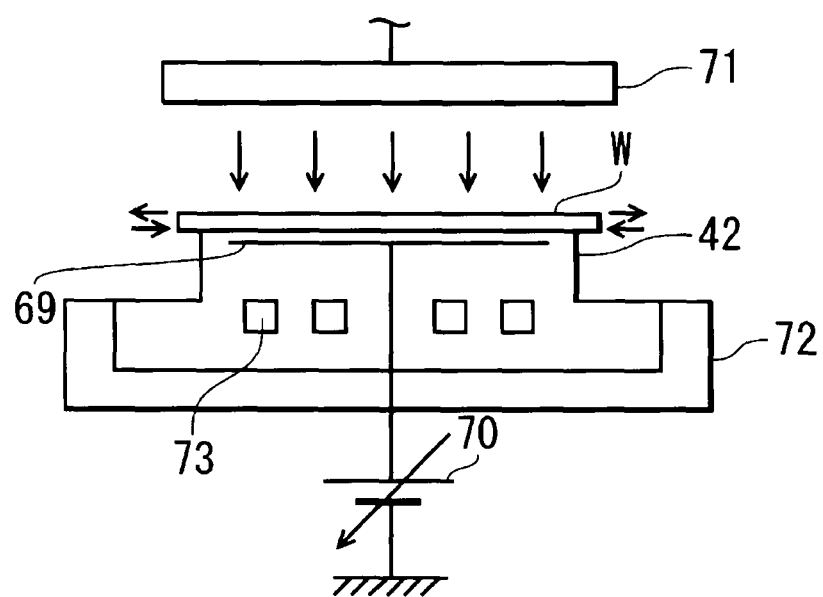
Figure 10A:
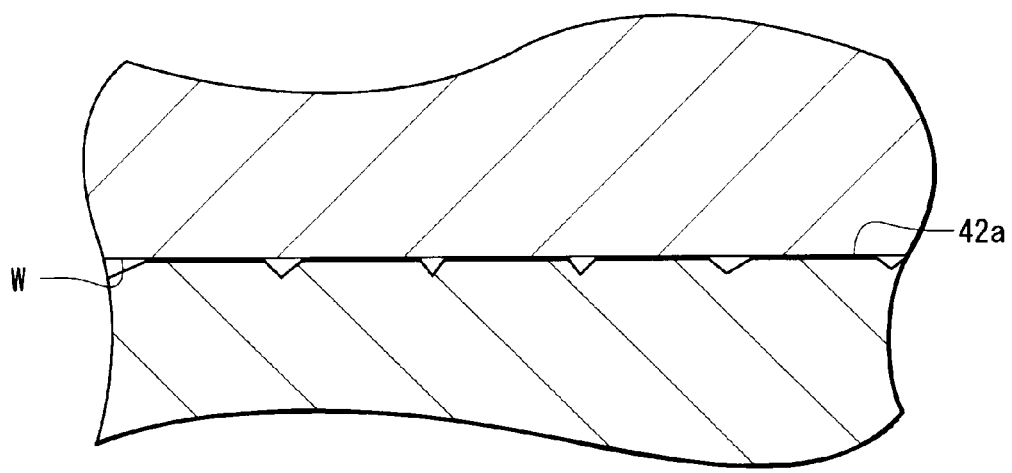
Figure 10B:
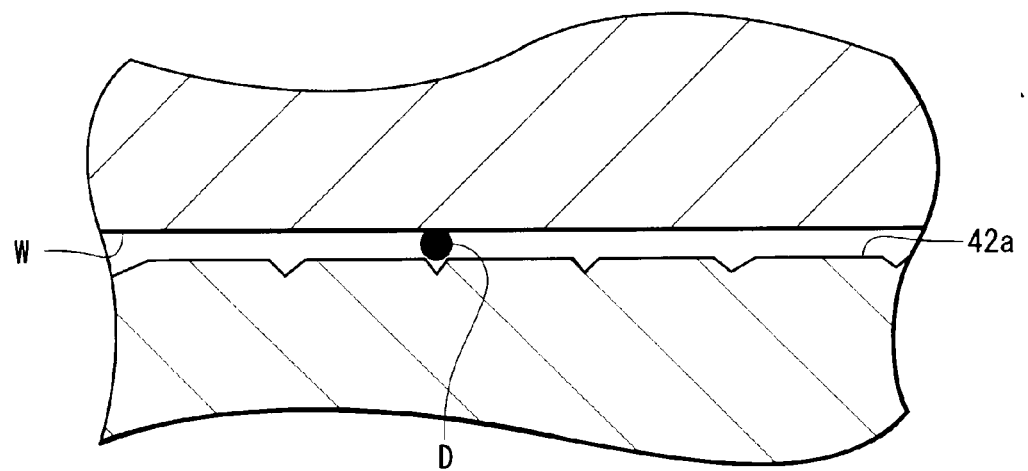

FIG. 8B is a view useful in explaining a sixth variation of the smoothing step in the surface treatment methods according to the above described embodiments.

As shown in FIG. 8B, a wafer W is mounted on the surface of the electrostatic chuck 42, and a negative DC voltage is applied from a DC power source 70 to the electrode plate 69 inside the electrostatic chuck 42 so that the wafer W is attracted to the surface of the electrostatic chuck 42. Then, a heating step in which a heating element 71 such as a lamp heats the wafer W so that the wafer W is thermally expanded, and a cooling step in which a coolant, for example cooling water or a Galden (registered trademark) fluid, at a predetermined temperature is supplied into a coolant chamber 73 inside the electrostatic chuck 42 from a chiller unit (not shown), and the wafer W is cooled through the temperature of the coolant or by a cooling jacket 72 covering the periphery of the electrostatic chuck 42 so that the wafer W is contracted are repeatedly carried out. At this time, the thermally sprayed coating film 51 on the surface of the electrostatic chuck 42 is ground through the thermal expansion and contraction of the wafer W, and the extreme surface layer of the surface of the electrostatic chuck 42 is smoothed.

According to the present variation, the wafer W is mounted on and attracted to the surface of the electrostatic chuck 42, and the wafer W is repeatedly thermally expanded and contracted so that the extreme surface layer of the surface of the electrostatic chuck 42 is smoothed. Thus, the extreme surface layer of the surface of the electrostatic chuck 42, which contacts the wafer W, can be finely smoothed.

It should be noted that in the present variation, in the case that the wafer W mounted on the surface of the electrostatic chuck 42 is made of silicon (Si) or the like having a lower hardness than the hardness of the material, e.g. alumina, of the thermally sprayed coating film 51 formed on the surface of the electrostatic chuck 42, the top portions of the mountain-shaped portions in the extreme surface layer of the surface of the electrostatic chuck 42 cut into the wafer W and are sheared. On the other hand, in the present variation, if the wafer W is a member made of silicon carbide (SiC) or the like having a higher hardness than the hardness of the material, e.g. alumina, of the thermally sprayed coating film 51, the top portions of the mountain-shaped portions in the extreme surface layer of the surface of the electrostatic chuck 42 are rubbed by the wafer W.

In the present variation as well, attachment and detachment of the wafer W may be repeated. Moreover, the heating element 71 of the present variation may be a ceramics heater or the like and may directly heat the wafer W.

Further, in the present variation, there may be provided a device that lifts the wafer W up so as to remove residue after grinding, or rotates or replaces the wafer W while the heating step and the cooling step are being repeatedly carried out. Moreover, in order to increase the speed at which the surface of the electrostatic chuck 42 is processed, fine abrasive grains may be added to a gap between the wafer W and the surface of the electrostatic chuck 42 or the rear surface of the wafer W may be roughed so that the thermally sprayed coating film 51 on the surface of the electrostatic chuck 42 can be easily ground. Moreover, abrasive grains electrodeposited on the rear surface of the wafer W may be used as a grinding member. Also, the member mounted on the surface of the electrostatic chuck 42 is not limited to being the wafer W, but rather may be any member (processed member) that can be electrostatically attracted to and detached from the surface of the electrostatic chuck 42.

Through the smoothing step in the surface processing methods of the above described embodiments, the extreme surface layer of the surface of the electrostatic chuck 42 is smoothed, and a fractured layer on the surface of the electrostatic chuck is removed. As a result, particles can be prevented from arising through the contact between the wafer W and the surface of the electrostatic chuck 42.

Moreover, the present invention may be applied to not only a substrate mounting stage whose surface has a thermally sprayed coating film formed thereon, but also a substrate mounting stage whose surface is made of a ceramic formed by firing or the like.

What is claimed is:

1. A substrate mounting stage, wherein
    an electrostatic chuck made of ceramics and having an attracting surface on which a substrate is mounted is provided in an upper portion of the substrate mounting stage,
    an arithmetic average roughness (Ra) of the attracting surface is not less than 0.45 μm, and an initial wear height (Rpk) of the attracting surface is not more than 0.35 μm, and
    a roughness curve skewness (Rsk) of the attracting surface is not more than −1.5.

2. A substrate mounting stage as claimed in claim 1, wherein the substrate attracting surface is ground through grinding processing.

3. A substrate mounting stage as claimed in claim 1, wherein the substrate attracting surface has a plurality of projections in contact with the substrate, and
    tops of the plurality of projections are ground flat.

4. A substrate mounting stage as claimed in claim 1, wherein a plurality of mountain-shaped portions and valley-shaped portions are formed on the substrate attracting surface by roughly grinding the substrate attracting surface through grinding processing, and top portions of the respective mountain-shaped portions are further ground flat.

5. A substrate mounting stage as claimed in claim 1, wherein the ceramics form a thermally sprayed coating film.

6. A substrate mounting stage as claimed in claim 1, wherein an arithmetic average wave (Wa) of the attracting surface is not less than 0.07.

7. A substrate processing apparatus, comprising:
a chamber in which a substrate is housed;
a substrate mounting stage that is disposed in said chamber and on which the substrate is mounted; and
an exhausting unit that exhausts said chamber,
wherein an electrostatic chuck made of ceramics and having an attracting surface on which the substrate is mounted is provided in an upper portion of the substrate mounting stage,
wherein an arithmetic average roughness (Ra) of the attracting surface of said electrostatic chuck is not less than 0.45 μm, and an initial wear height (Rpk) of the attracting surface is not more than 0.35 μm, and
wherein a roughness curve skewness (Rsk) of the attracting surface is not more than −1.5.

8. A substrate processing apparatus as claimed in claim 7, wherein an arithmetic average wave (Wa) of the attracting surface is not less than 0.07.

9. A substrate processing apparatus as claimed in claim 7, further comprising a plasma producing unit that produces plasma in said chamber.

10. A substrate processing apparatus as claimed in claim 7, further comprising a DC power source that is connected to an electrode disposed in said electrostatic chuck and applies a DC voltage to the electrode.

11. A substrate processing apparatus as claimed in claim 7, further comprising a radio frequency power source that is connected to said mounting stage and supplies a radio frequency electrical power to said mounting stage.

12. A substrate processing apparatus as claimed in claim 7, wherein the substrate attracting surface is ground through grinding processing.

13. A substrate processing apparatus as claimed in claim 7, wherein a plurality of mountain-shaped portions and valley-shaped portions are formed on the attracting surface by roughly grinding the attracting surface through grinding processing, and top portions of the respective mountain-shaped portions are further ground flat.

14. A substrate processing apparatus as claimed in claim 7, wherein the ceramics form a thermally sprayed coating film.

15. A substrate mounting stage, wherein
an electrostatic chuck made of ceramics and having an attracting surface on which a substrate is mounted is provided in an upper portion of the substrate mounting stage,
an arithmetic average roughness (Ra) of the attracting surface is not less than 0.45 μm, and an initial wear height (Rpk) of the attracting surface is not more than 0.35 μm, and
a roughness curve relative load length rate (Rmr (−0.5 μm)) of the attracting surface is not less than 5%.

16. A substrate processing apparatus, comprising:
a chamber in which a substrate is housed;
a substrate mounting stage that is disposed in said chamber and on which the substrate is mounted; and
an exhausting unit that exhausts said chamber,
wherein an electrostatic chuck made of ceramics and having an attracting surface on which the substrate is mounted is provided in an upper portion of the substrate mounting stage,
wherein an arithmetic average roughness (Ra) of the attracting surface of said electrostatic chuck is not less than 0.45 μm, and an initial wear height (Rpk) of the attracting surface is not more than 0.35 μm, and
wherein a roughness curve relative load length rate (Rmr (−0.5 μm)) of the attracting surface is not less than 5%.

\* \* \* \* \*